(12) United States Patent
Saeki

(10) Patent No.: US 6,499,367 B1
(45) Date of Patent: Dec. 31, 2002

(54) DEVICE AND METHOD FOR DETECTING SUBSTRATE

(75) Inventor: Hiroaki Saeki, Shirane-Machi (JP)

(73) Assignee: Tokyo Electron Limited, Toyko-to (JP)

( * ) Notice: Subject to any disclaimer, the term of this patent is extended or adjusted under 35 U.S.C. 154(b) by 0 days.

(21) Appl. No.: 09/509,075

(22) PCT Filed: Sep. 21, 1998

(86) PCT No.: PCT/JP98/04245

§ 371 (c)(1),
(2), (4) Date: Mar. 22, 2000

(87) PCT Pub. No.: WO99/16121

PCT Pub. Date: Apr. 1, 1999

(30) Foreign Application Priority Data

Sep. 23, 1997 (JP) ............................................. 9-275079

(51) Int. Cl.⁷ .......................... G01B 11/00; B65G 49/07; G01M 19/00; H01L 21/66; H01L 21/68
(52) U.S. Cl. .......................... 73/865.9; 33/549; 356/621; 414/935; 438/14
(58) Field of Search ........................... 73/865.9, 865.8; 438/14; 414/935; 33/549, 555, 568, 573; 356/621, 615, 622; 250/559.29, 559.3, 559.36, 559.37

(56) References Cited

U.S. PATENT DOCUMENTS

| | | | | |
|---|---|---|---|---|
| 3,524,953 A | * | 8/1970 | Coughlin et al. | 200/61.42 |
| 3,552,177 A | * | 1/1971 | Orlando et al. | 72/338 |
| 4,609,563 A | * | 9/1986 | Shimrock et al. | 427/8 |
| 5,124,522 A | * | 6/1992 | Booke et al. | 219/121.19 |
| 5,266,812 A | * | 11/1993 | Mokuo | 414/938 X |
| 5,558,482 A | * | 9/1996 | Hiroki et al. | 414/217 |
| 5,660,114 A | * | 8/1997 | Gruber | 104/168 |
| 5,700,127 A | * | 12/1997 | Harada et al. | 414/416 |
| 5,831,851 A | * | 11/1998 | Eastburn et al. | 700/114 |
| 5,834,915 A | * | 11/1998 | Babbs et al. | 414/935 X |
| 5,906,158 A | * | 5/1999 | Takai | 101/123 |
| 5,972,184 A | * | 10/1999 | Hollars et al. | 204/198.09 |
| 2001/0009641 A1 | * | 7/2001 | Haraguchi et al. | 414/416.03 |

FOREIGN PATENT DOCUMENTS

| | | | | |
|---|---|---|---|---|
| EP | 844531 A2 | * | 5/1998 | ............ G03F/7/20 |
| JP | 2-9438 | | 1/1990 | |
| JP | 2-74093 A | * | 3/1990 | ................. 29/829 |
| JP | 6-37500 A | * | 2/1994 | ......... H05K/13/08 |
| JP | 7-53012 A | * | 2/1995 | ............ B65G/1/00 |
| JP | 7-201952 | | 8/1995 | |
| JP | 8-31913 | | 2/1996 | |
| JP | 10-207042 A | * | 8/1998 | .......... H01L/21/27 |

* cited by examiner

Primary Examiner—Thomas P. Noland
(74) Attorney, Agent, or Firm—Smith, Gambrell & Russell, LLP

(57) ABSTRACT

The invention has an object to provide a substrate detecting device which is capable of detecting the presence of a substrate and the existence of the substrate's off-position by a low number of substrate sensing parts. In the substrate detecting device for detecting both presence and off-position of the substantially circular substrate W mounted on a substrate mounting part 26, the device includes the plural substrate sensing parts 50, 52 arranged somewhat inward from the outer peripheral edge of the substrate mounted on the substrate mounting part and also arranged at substantially regular intervals along the circumferential direction of the substrate and a judgement controlling unit 40 for judging the presence of the substrate and the existence of the off-position on the ground of respective outputs from the plural substrate sensing parts. Consequently, the presence of the substrate and the existence of the off-position in excess of an allowance can be detected by e.g. three sensing parts.

6 Claims, 10 Drawing Sheets

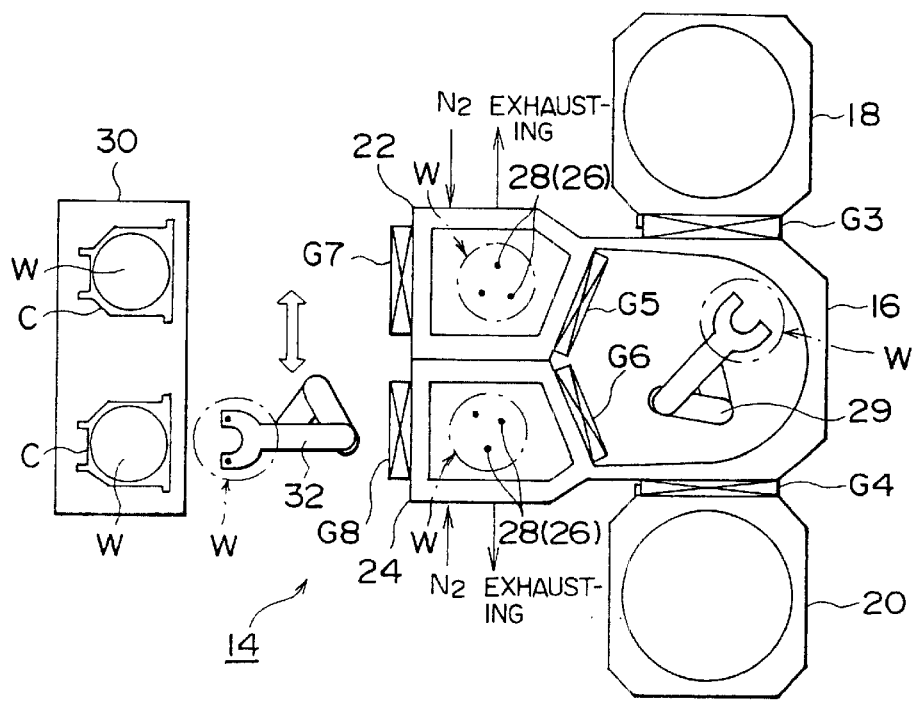
F I G. 1
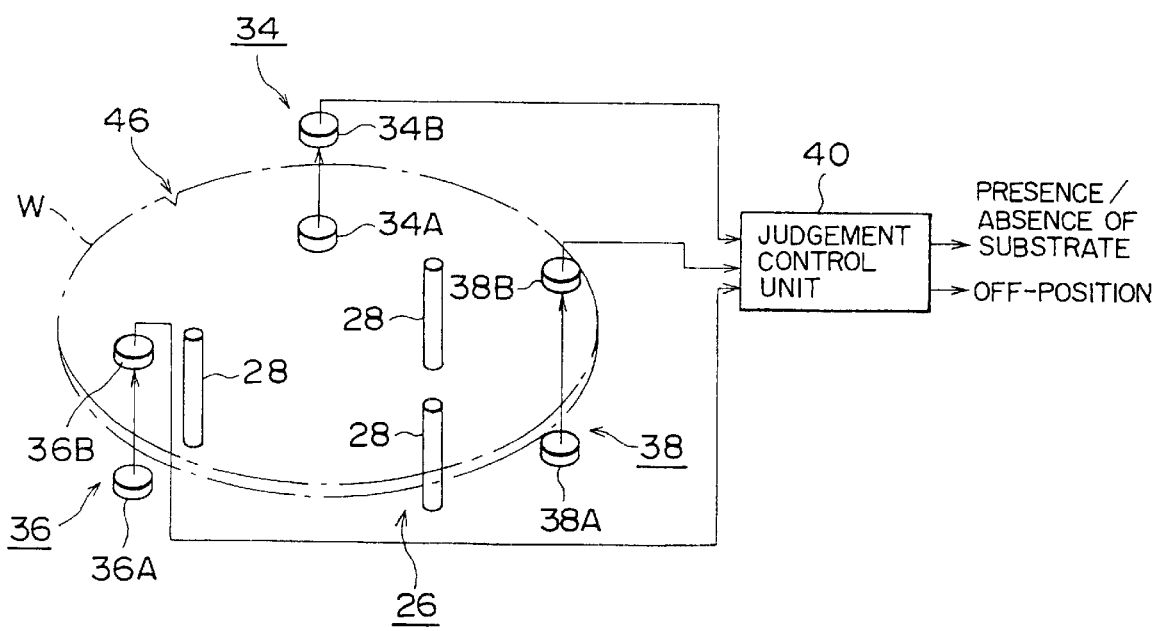
F I G. 2

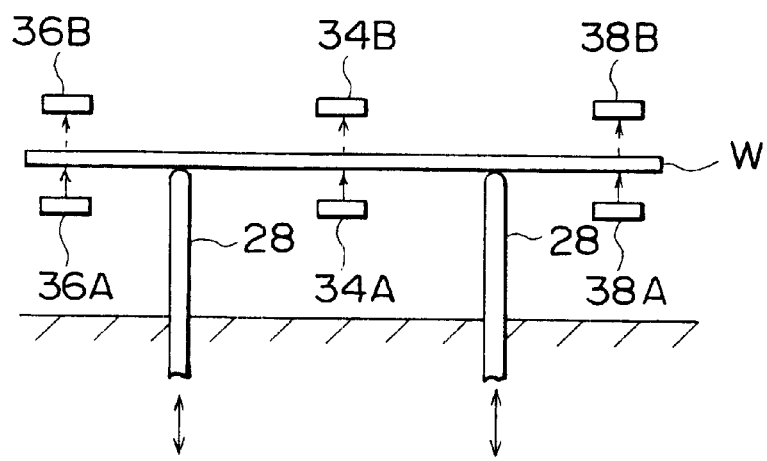
F I G. 3
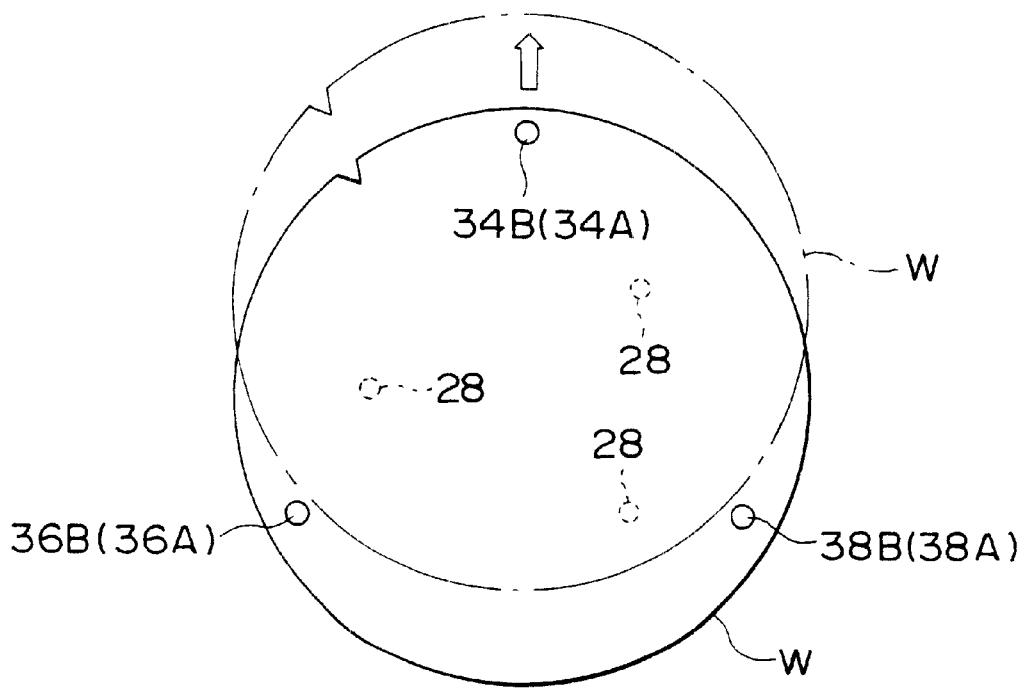
F I G. 4

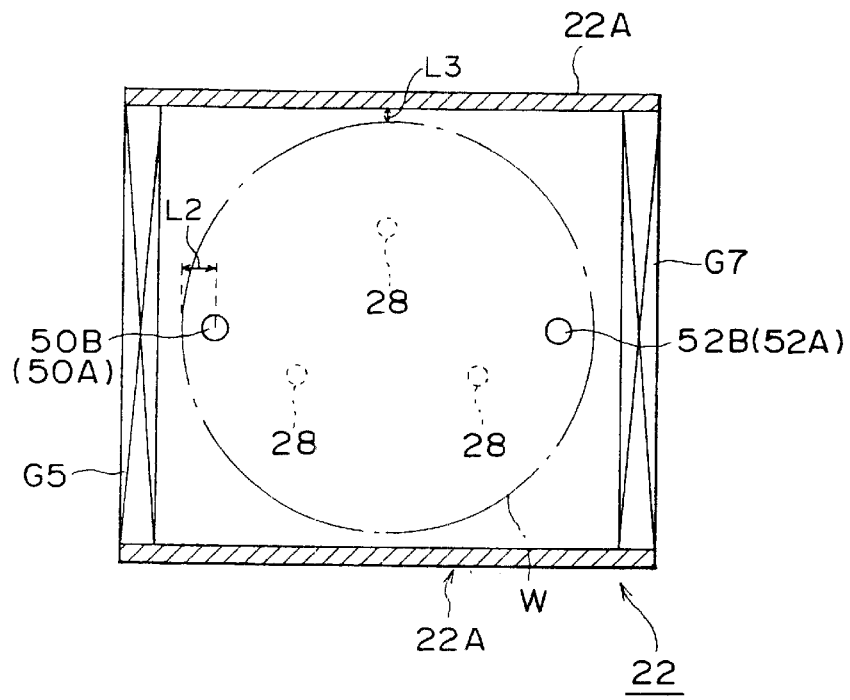
F I G. 8
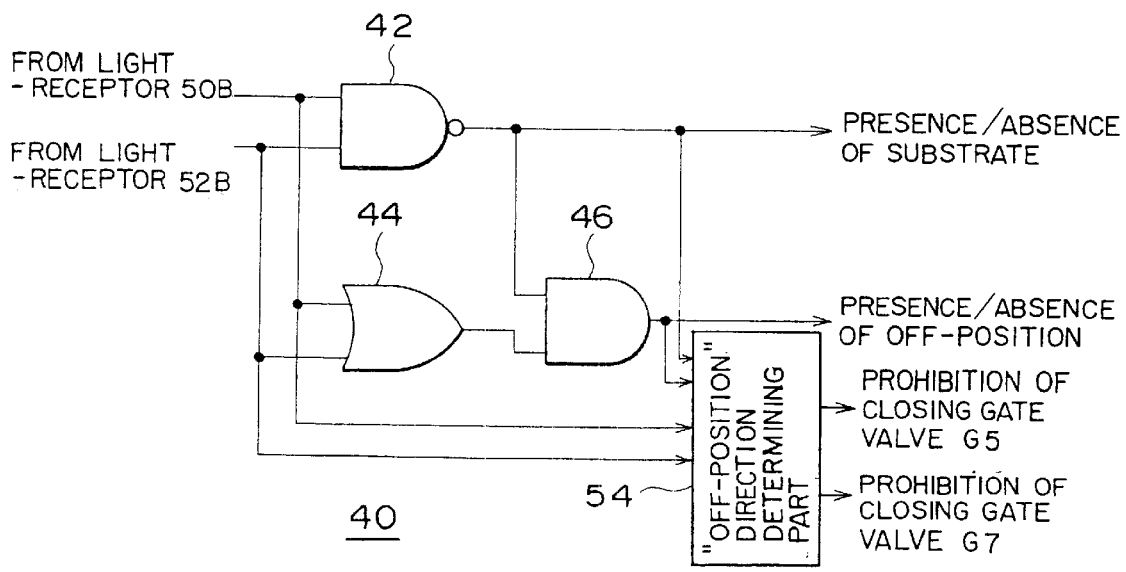
F I G. 9

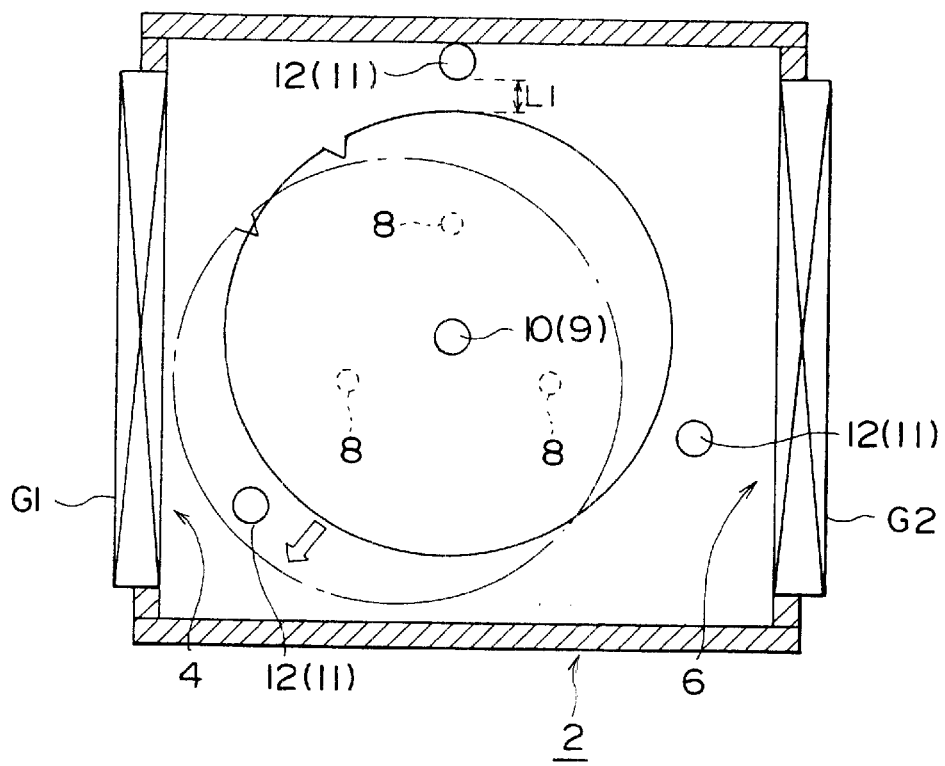
F I G. 14
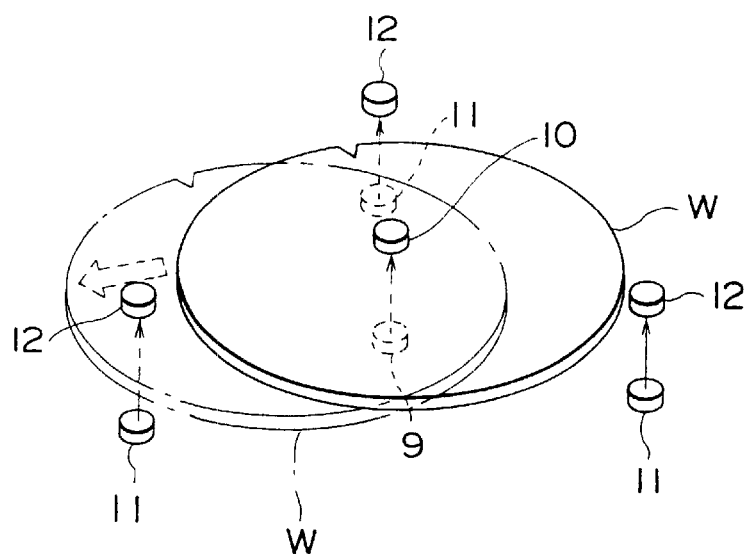
F I G. 15

DEVICE AND METHOD FOR DETECTING SUBSTRATE

TECHNICAL FIELD OF THE INVENTION

The present invention relates to a substrate detecting device for detecting both presence and off-position (positional deviation) of a substrate, such as a semiconductor wafer and also relates to a method of detecting the presence and off-position of the substrate.

BACKGROUND OF THE INVENTION

Generally, in order to perform a designated process for the substrate, for example, the semiconductor wafer in a processing apparatus devices, it is executed to first take out one substrate from a cassette unit capable of accommodating a plurality of substrates and secondly load the substrate into a load-locking chamber capable of forming a vacuum in its interior. After evacuating the interior of the load-locking chamber, the substrate is loaded into the processing apparatus via a vacuum transfer chamber evacuated in advance. When unloading the processed substrate out of the processing apparatus, it is transferred in the opposite course to the above-mentioned course.

The reason for the load-locking chamber's mediation in loading and unloading the substrate is as follows: for the purpose of delivering the substrate between the cassette unit exposed into the atmospheric pressure and the vacuum transfer chamber or the processing apparatus maintained in the vacuum, if there is such a load-locking chamber, which is capable of getting both vacuum condition and atmospheric condition rapidly and easily, between the cassette unit and the vacuum chamber or the processing apparatus, the speedy operation of loading/unloading of the wafers could be accomplished without breaking a vacuum in the vacuum transfer chamber or the processing apparatus.

Besides, by the above-mentioned reason, the volume of the load-locking chamber is established as small as possible. Further, the load-locking chamber is provided, at its loading/unloading port for the substrate, with a gate valve which allows the port to be closed in an airtight manner. However, if the substrate is accommodated in the load-locking chamber while being shifted from the formal position in excess of the allowance, it may be an impossibility for a transfer arm to carry the substrate in the off-position. Alternatively, if the worst comes to the worst, the substrate in the off-position may be pinched and broken by the gate valve.

In order to solve such a drawback, there has been proposed a substrate detecting device which is arranged in the load-locking chamber, for confirming the presence of the substrate in the chamber and the existence of the substrate's off-position in excess of a predetermined allowance for the substrate.

FIG. 14 is a plan view showing the above load-locking chamber and the substrate detecting device disposed in the load-locking chamber and FIG. 15 is a perspective view showing the interior of the load-locking chamber. The load-locking chamber 2 is constituted by a thin and square container capable of forming a vacuum, which is made of e.g. stainless steel. The load-locking chamber 2 is provided, on opposing walls thereof, with loading/unloading ports 4, 6 through which the substrate W, such as semiconductor wafer, is carried in and out. Gate valves G1, G2 capable of closing in an airtight manner are arranged on the loading/unloading ports 4, 6, respectively.

In the load-locking chamber 2, for example, three support pins 8 movable up and down are arranged so as to stand in the form of a substantially regular triangle and support the substrate W thereon. In a position corresponding to the general center of the substrate W, an optical emitter 9 and an optical receptor 10 in pairs are respectively arranged below and above the substrate W, for identifying the existance of the substrate. Also in a position separated outward from the outer peripheral edge of the substrate W by a small clearance L1, a lower optical emitter 11 and an upper optical receptor 12 in pairs are arranged in order to confirm whether the substrate is in the "off-position" or not. In the shown example, three pairs of emitters 11 and receptors 12 for confirmation of the off-position are arranged in the circumferential direction of the substrate W at substantially regular intervals. With the arrangement, when the substrate W is shifted from the formal position in excess of an allowance (L1), the confirmation of the off-position is carried out since the light from the emitter 11 existing in the direction of the off-position is cut off by the substrate W.

Meanwhile, in the conventional substrate detecting device mentioned above, the rising in manufacturing cost is caused due to the requirement for at least four pairs of emitters and receptors. Additionally, with the arrangement where the emitters 11 and the receptors 12 for confirmation of the off-position are positioned outside the outer peripheral edge of the substrate, the interior space or volume of the load-locking chamber 2 is increased to cause the installation space to be enlarged with an increase in time required for evacuating the chamber.

Under such a situation, the present invention originates in the demand for solving the above-mentioned problems effectively. It is therefore an object of the present invention to provide a substrate detecting device which is capable of detecting the presence of the substrate and the existence of the substrate's off-position by the information from a small number of substrate detecting sensing parts and also provide a substrate detecting method using the above substrate detecting device.

DISCLOSURE OF THE INVENTION

The 1st. feature of the present invention resides in: a substrate detecting device for detecting presence and off-position of a substrate mounted on a substrate mounting part, the substrate detecting device comprising a plurality of substrate sensing parts each of which is arranged in a position inward departing from an outer peripheral edge of the substrate arranged in a designated position on the substrate mounting part, by a predetermined distance and which are arranged in the circumferential direction of the substrate at intervals; and a judgement controlling unit for judging the presence of the substrate on the substrate mounting part and the existence of the substrate's off-position being deviated from the designated position, on the ground of respective outputs from the substrate sensing parts.

With the above constitution, since the plural substrate sensing parts are arranged in respective positions just inward departing from the outer peripheral edge of the substrate and also departing from each other in the circumferential direction of the substrate, the judgement controlling unit can judge the presence of the substrate on the substrate mounting part and the existence of the substrate's off-position in excess of an allowance predetermined for the substrate, on the basis of the outputs from the substrate sensing parts.

The 2nd. feature of the present invention resides in that the judgement controlling unit of the substrate detecting device judges the presence of the substrate on condition that at least one of the plural substrate sensing parts detects the presence of the substrate; and the off-position of the substrate on condition that at least one of the plural substrate sensing parts does detect the presence of the substrate and at least one of the other substrate sensing parts does not detect the substrate. In this case, it means that the substrate is in the off-position where it is shifted from the substantial center of the substrate toward the sensing part detecting the presence of the substrate.

The 3rd. feature of the present invention resides in that the substrate to be subjected to judgement for the presence and off-position is shaped to be substantially circular.

The 4th. feature of the present invention resides in that the substrate sensing parts are at least three in number. In this way, if only providing the sensing parts of three in number, more or less, then it is possible to confirm the presence of the substrate and the existence of off-position of the substrate, thereby not only reducing the number of sensors but controlling the installation space.

The 5th. feature of the present invention resides in that the plural substrate sensing parts are arranged in the circumferential direction of the substrate at substantially regular intervals.

The 6th. feature of the present invention resides in that the substrate detecting device further comprises a pair of opposing substrate restricting walls which are arranged on both sides of the substrate mounting part, for restricting the position of the substrate on the inside of the substrate restricting walls.

The 7th. feature of the present invention resides in that the substrate sensing parts of two in number, are arranged in a direction substantially perpendicular to the opposing direction of the substrate restricting walls in pairs.

The 8th. feature of the present invention resides in that the substrate to be subjected to judgments for the presence and off-position thereof is shaped to be substantially square.

The 9th. feature of the present invention resides in that the plural substrate sensing parts are arranged on respective corners of the square-shaped substrate.

The 10th. feature of the present invention resides in that the plural substrate sensing parts are arranged on two corners of respective corners of the square-shaped substrate, the two corners being in a diagonal direction of the substrate.

The 11th. feature of the present invention resides in that the substrate detecting device further comprises a pair of opposing substrate restricting walls which are arranged on both sides of the substrate mounting part, for restricting the position of the substrate to the inside of the substrate restricting walls, wherein a distance between the pair of opposing substrate restricting walls is longer than a distance between opposing sides defining the square-shaped substrate by a predetermined distance.

The 12th. feature of the present invention resides in that the plural substrate sensing parts of two in number are arranged in a direction substantially perpendicular to the opposing direction of the substrate restricting walls.

The 13th. feature of the present invention resides in that the substrate detecting device further comprises an accommodating chamber for accommodating the substrate mounting part therein, wherein the accommodating chamber is provided with an opening and closing door through which the substrate to be mounted on the substrate mounting part can be loaded into and unloaded from the accommodating chamber. control unit prohibits the closing operation of the opening and closing door when the off-position of the substrate is detected. Consequently, it is possible to prevent the substrate from being damaged by the door's pinching.

The 15th. feature of the present invention resides in that the accommodating chamber is identical to a load-locking chamber capable of forming a vacuum therein.

The 16th. feature of the present invention resides in that the predetermined distance between the outer peripheral edge of the substrate and each of the substrate sensing parts ranges from 5 mm to 10 mm for the substrate of 12 inches in size.

The 17th. feature of the present invention resides in a method of detecting presence and off-position of a substrate mounted on a substrate mounting part by using a substrate detecting device, the substrate detecting device including the substrate mounting part for mounting the substrate thereon and a plurality of substrate sensing parts arranged in respective positions just inward departing from an outer peripheral edge of the substrate in a designated position on the substrate mounting part and also departing from each other in the circumferential direction of the substrate, the method comprising the steps of judging the presence of the substrate on condition that at least one of the plural substrate sensing parts does detect the presence of the substrate; and judging the off-position of the substrate on condition that at least one of the plural substrate sensing parts does detect the presence of the substrate and at least one of the other substrate sensing parts does not detect the substrate.

BRIEF DESCRIPTION OF THE DRAWINGS

FIG. 1 is a schematically structural view showing the constitution of a "cluster tool" type of processing apparatus equipped with a substrate detecting device of the present invention;

FIG. 2 is a perspective view showing the substrate detecting device in accordance with the first embodiment of the present invention;

FIG. 3 is a side view showing a substrate detecting sensing part of the substrate detecting device of FIG. 2;

FIG. 4 is a plan view showing the substrate detecting sensing part of the substrate-detecting device of FIG. 2;

FIG. 8 is a plan view of the substrate detecting device of FIG. 7;

FIG. 9 is a constructive view showing the circuits in the judgement control unit of the substrate detecting device of FIG. 7;

FIG. 14 is a plan view showing the load-locking chamber and the conventional substrate detecting device arranged in the load-locking chamber; and FIG. 15 is a perspective view showing the conventional substrate detecting device of FIG. 14.

BEST MODE OF EMBODIMENTS OF THE INVENTION

Embodiments of the substrate detecting device and method of the present invention will be described below with reference to the attached drawings.

Figure 5:
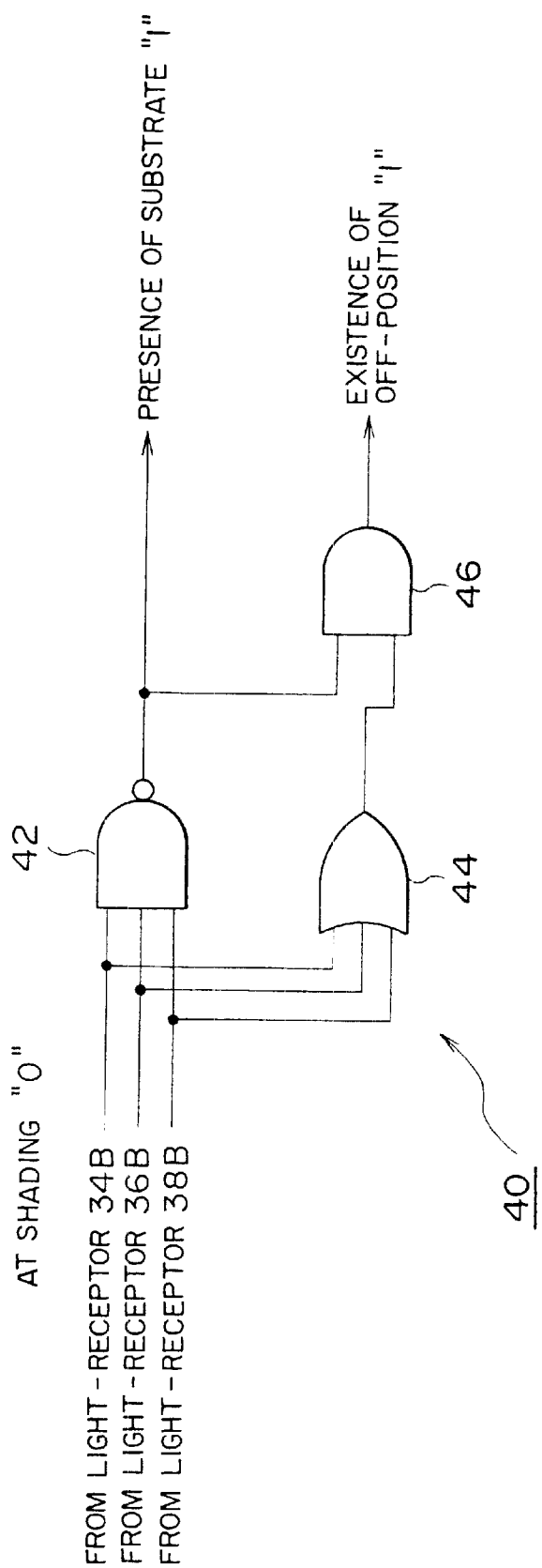
FIG. 5 is a constructive view showing circuits of a judgement control unit in the substrate detecting device of FIG. 2.

FIG. 1 is a schematically structural view showing the constitution of a "cluster tool" type of processing apparatus equipped with the substrate detecting device of the present invention; FIG. 2 is a perspective view showing the substrate detecting device in accordance with the first embodiment of the present invention; FIG. 3 is a side view showing a substrate detecting sensing part of the substrate detecting device of FIG. 2; FIG. 4 is a plan view showing the substrate detecting sensing part of the substrate detecting device of FIG. 2; and FIG. 5 is a constructive view showing a circuit of a judgement control section. In FIG. 2, there is shown a substrate mounted in an appropriate position with no positional deviation, by alternate long and short dash lines. In FIG. 4, the substrate in the appropriate portion is designated by a solid line, while a substrate in the off-position is designated by alternate long and short dash lines.

Firstly, we now describe the cluster tool type of processing apparatus.

As shown in FIG. 1, this processing apparatus 14 includes two vacuum processing chambers 18, 20 connected with a vacuum transfer chamber 16 through gate valves G3, G4 as closing/opening doors. The processing apparatus 14 is adapted so as to apply designated treatments, for example, film deposition, oxidation diffusion, etc. on the substrates W of semiconductor wafers in the vacuum processing chambers 18, 20.

Two load-locking chambers 22, 24 are connected to the vacuum transfer chamber 16 through the intermediary of gate valves G5, G6, respectively. The interiors of the load-locking chambers 22, 24 are constructed so as to form vacuums and also capable of being purged by e.g. $N_2$ gas in order to return to the atmospheric pressure. Arranged in the form of a substantially regular triangle in each one of the load-locking chambers 22, 24 are three quartz support pins 28 which stand up from a bottom of each load-locking chamber 22, 24, providing a substrate mounting part 26. The support pins 28 are movable up and down in the chambers 22, 24. In the chambers 22, 24, the substantially circular substrates W are mounted and carried on the support pins 28.

A conveyer arm 29 capable of bending, stretching and turning is arranged in the vacuum transfer chamber 16 to carry out the loading/unloading operations for the substrate W between the load-locking chambers 22, 24 and two vacuum processing chambers 18, 20.

On respective front sides of the load-locking chambers 22, 24, gate valves G7, G8 are provided to make and break the atmospheric environment in the chambers. The loading/unloading of the substrates W is executed on condition of opening the valves G7, G8.

In front of the load-locking chambers 22,24, a cassette table 30 is provided for mounting cassettes C each accommodating the plural substrates therein. The delivery of the substrates W between the cassettes C and the load-locking chambers 22, 24 is carried out by a deliver arm 32 which is positioned between the cassette table 30 and the load-locking chambers 22, 24, and capable of moving up and down, bending, stretching and turning. Note, in the front of the load-locking chambers 22, 24, the deliver arm 32 of the embodiment is also capable of sliding in order to take charges of two load-locking chambers 22, 24 solely.

Meanwhile, each of the load-locking chambers 22, 24 is formed to define a substantially square space, the substrate detecting devices of the invention are arranged in the load-locking chambers 22, 24, respectively.

As fully shown in FIGS. 2 and 3, each substrate detecting device is mainly constituted by plural, in this case, three substrate sensing parts 34, 36, 38 and a judgement control unit 40 for judging the presence of the substrate W and the existence of the off-position in excess of the allowance on the ground of respective outputs from the substrate sensing parts.

The respective substrate sensing parts 34, 36, 38 comprise three pairs of optical emitters 34A, 36A, 38A and optical receptors 34B, 36B, 38B for receiving lights from the emitters. Above and below the substrate W mounted on the support pins 28, these parts 34, 36, 38 are arranged so as to interpose the substrate W between the emitters 34A, 36A, 38A and the receptors 34B, 36B, 38B, respectively. In the shown embodiment, the emitters 34A, 36A, 38A are positioned below the substrate W, while the receptors 34B, 36B, 38B are positioned above the substrate W Of course, these elements may be turned upside down in the modification.

Now, it is a point of great importance that the emitters 34A, 36A, 38A and the receptors 34B, 36B, 38B are not disposed outside the outer peripheral edge of the generally circular substrate W but inside the outer peripheral edge of the substrate W to be mounted on the pins 28 with no shift from the formal position. That is, as also shown in FIG. 4, the emitters 34A, 36A, 38A and the receptors 34B, 36B, 38B are arranged in the circumferential direction of the substrate W at generally regular intervals and also positioned inside the outer peripheral edge of the substrate W without the off-position (shown with a solid line of FIG. 4) by a small distance L2. The distance L2 is equal to the maximum allowable distance for the substrate W in the off-position. For example, in case of the substrate having the size of 12 in., the distance L2 will be from 5 to 10 mm, more or less. When the substrate does exist, the light emitted from one emitter is intercepted by the substrate, so that the output from the corresponding receptor results in "0". The respective outputs from the receptors 34B, 36B, 38B are inputted into the judgement control unit 40, such as a micro-computer or the like, where it is executed to judge the presence of the substrate W and the existence of off-position exceeding the allowance. Note, a small cut-out 46 formed on the periphery of the substrate W designates a notch representing the orientation of the substrate W.

As shown in FIG. 5, the judgement control unit 40 comprises a NAND circuit 42 which receives the outputs of the respective receptors 34B, 36B, 38B, an OR circuit 44 receiving the outputs of the respective receptors 34B, 36B, 38B likewise, and an AND circuit 46 which picks up both outputs from the OR circuit 44 and the NAND circuit 42. With the constitution, when any one of the three receptors 34B, 36B, 38B detects the presence of the substrate, the NAND circuit 42 generates the output of "1" where it is judged that the substrate is existing now. While the presence of the substrate is being judged, in other words, under condition of "1" for the output of the NAND circuit 42, if any one of the three receptors 34B, 36B, 38B detects the absence of the substrate, then the AND circuit 46 generates the output of "1" where it is judged that the substrate is shifted from the formal position, that is, it has the off-position.

Next, we describe the operation of the above-constructed device.

For first explanation of the general flow of the substrate W, in FIG. 1, the cassettes C having the plural substrates W are mounted on the cassette table 30 outside the processing apparatus 14. Owing to its elevating, bending and stretching, and turning operations, the deliver arm 32 receives the substrate W from the cassette C and loads it into the load-locking chamber 22 or the same 24 through the opening gate valve G7 or G8, so that the so-loaded substrate W is mounted on the support pins 28.

Then, upon closing the gate valve G7 or G8 to seal up the interior of the load-locking chamber 22 or 24, it is continuously evacuated to form a desired vacuum condition in the chamber. Thereafter, the opposite gate valve G5 or G6 is opened to communicate the load-locking chamber 22 or 24 with the vacuum transfer chamber 16 maintained in the vacuum previously. Owing to its elevating, bending and stretching, and turning operations, the conveyer arm 29 in the chamber 16 carries the substrate W in the load-locking chamber 22 or 24 and sequentially loads the substrate W into the vacuum processing chamber 18 or 20. Thereafter, the substrate W is subjected to the designated treatment.

In order to unload the processed substrate W out of the processing apparatus, it may be handled in accordance with the course in opposition to the above-mentioned course. In connection, the load-locking chambers 22, 24 may be allocated for the loading-side and uniloading-side, and vice versa.

Now, in such a loading/unloading process, both presence of the substrate W and existence of the off-position in excess of the allowance are judged in the load-locking chamber 22 or 24 by the substrate detecting device of the invention. Under condition that the substrate W is mounted on three support pins 28 in the load-locking chamber as shown in FIGS. 2 to 4, when the substrate W is arranged in the proper position without the off-position (in case of the substrate shown with the solid line of FIG. 4), the periphery of the substrate W enters between the emitters 34A, 36A, 38A and the receptors 34B, 36B, 38B of the substrate sensing parts 34, 36, 38 thereby to intercept respective optical paths.

Then, in the judgement control unit 40 of FIG. 5, the NAND circuit 42 generates the output of "1" representing the presence of the substrate. While, because of the output of "0" from the OR circuit 44, the AND circuit 46 which inputs both signals from the circuits 42, 44 generates the output of "0" representing that the substrate is not in the off-position.

Under such a normal situation, it is executed to carry on the loading/unloading operation of the substrate W, for example, to close the gate valve.

In spite of a small displacement of the substrate W retained on the support pins 28, if such an amount of "off-position" is within the predetermined allowance, then there is no change in the output from the judgement control unit 40, still representing the normal condition.

On the contrary, as the substrate W being shifted to the side of the substrate sensing part 34, which is shown by the alternate long and short dash lines in FIG. 4, if the substrate W is deviated from the two substrate sensing parts 36, 38 while the amount of off-position exceeds the allowance (L2), then the respective outputs from the receptors 36B, 38B become "1" together to represent the absence of the substrate. At this time, since the light for the receptor 34B is remained as being intercepted, the output of "0" is maintained to exhibit the presence of the substrate. Therefore, it is maintained that the NAND circuit 42 generates the output of "1", representing the presence of the substrate.

On the other hand, since the outputs from the receptors 36B, 38B are together reversed to "1", the output from the OR circuit 44 is turned to "1" and therefore, the output from the AND circuit 46 is also turned to "1", representing the appearance of the off-position.

In the shown example, the outputs of two receptors 36B, 38B are together turned to "1". Nevertheless, if either one of the outputs is only turned to "1", the output from the AND circuit 46 will be changed to "1" to represent the existence of off-position.

When the outputs from two receptors 36B, 38B simultaneously designate the absence of the substrate in the above-mentioned way, it means that the substrate W is shifted to the side of the remained receptor 34B. While, when one of the receptors, for example, the receptor 36B designates the absence of the substrate, it means that the substrate W is shifted to the substantially intermediate direction between the remained receptors 34B, 38B.

That is, when any one of three substrate sensing parts 34, 36, 38 detects the presence of the substrate, then it is judged that the substrate is present. Under this situation, if any one of the three sensing parts detects the absence of the substrate, it is judged that there is the off-position more than the allowance. When there is a judgement of the off-position in excess of the allowance, the interruption of the loading/unloading of the substrate, for example, the prohibition of the closing operation of the gate valve is carried out due to the occurrence of possibility of the damaged substrate W and thereafter, the operation will be recovered, for example, on the operator's confirmation of the situation.

Figure 6:
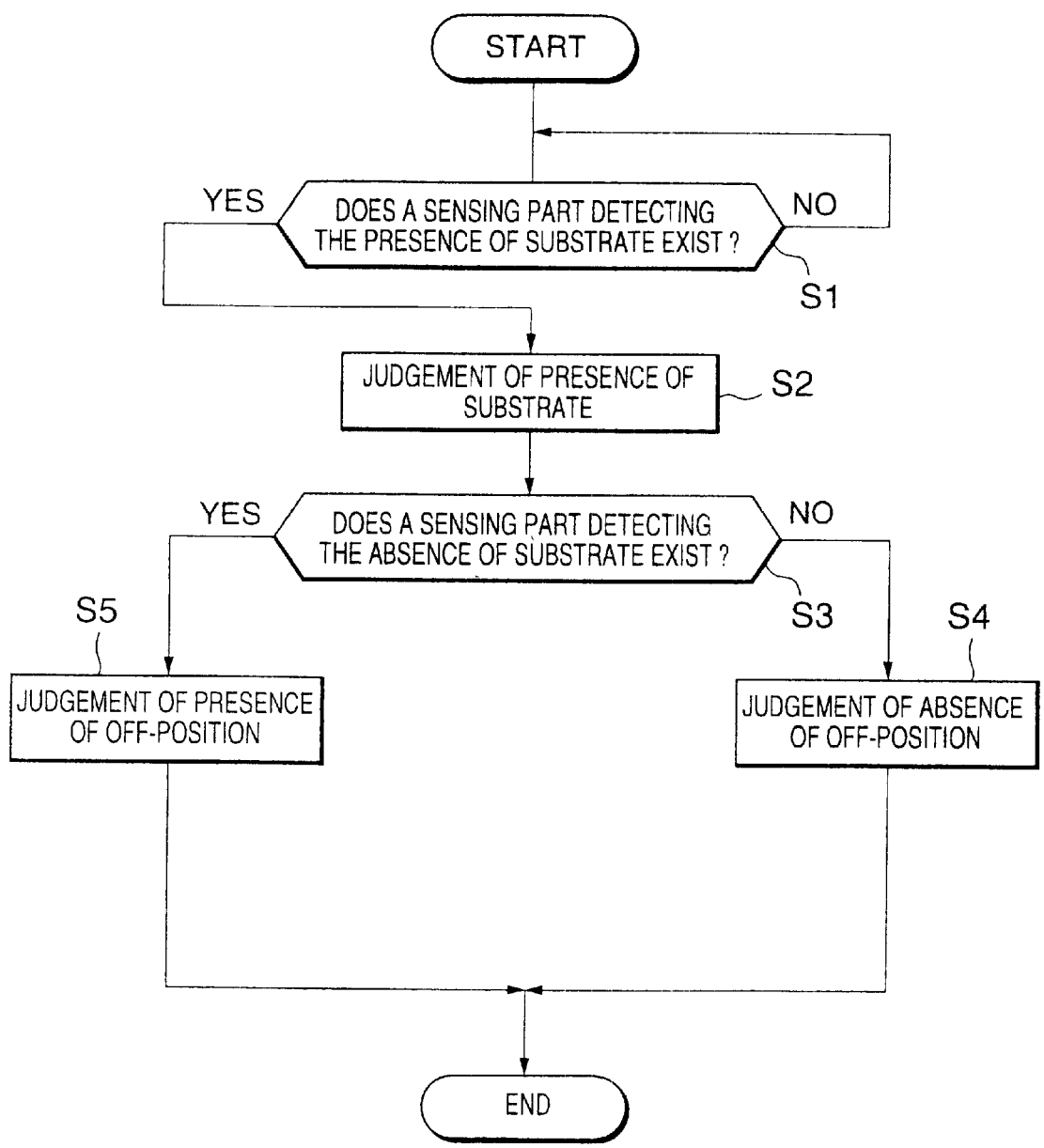
FIG. 6 is a flow chart for explanation of the operation of the first embodiment of the present invention.

We now describe such a series of operations with reference to the flow of FIG. 6, summarily.

First, upon the operation of the substrate detecting device, it is executed to judge whether at least one of the three substrate sensing parts 34, 36, 38 does detect the presence of the substrate (S1). This judgement process is repeated until the appearance of the sensing part detecting the presence of the substrate.

If there is even one sensing part detecting the presence of the substrate, then the judgement control unit 40 judges that the substrate W is present (S2). Further, it is judged whether there exists the substrate sensing part detecting the absence of the substrate or not (S3). When the judgement is NO, that is, in case of all of the sensing parts detecting the presence of the substrate, then the judgement control unit 40 judges that the substrate W is not in the off-position but the formal position (S4). On the contrary, when the judgement at step S3 is YES, that is, in case of even one sensing part detecting the absence of the substrate, then the judgement control unit 40 judges that the substrate W is in the off-position (S5).

In this way, according to the embodiment, it is possible to judge the presence of the substrate and the existence of off-position owing to the provision of three substrate sensing parts 34, 36, 38 at the minimum, thereby allowing the number of sensors on use to be reduced.

Further, since the respective substrate sensing parts 34, 36, 38 are positioned inside the outer peripheral edge of the substrate W in the formal position by the allowance (L2) for the off-position, more or less, the installation space can be decreased as much, so that it is possible to reduce the load-locking chamber's interior space or volume occupied by the device in comparison with the occupation by the device shown in FIGS. 14 and 15.

In the above embodiment, there is ensured a sufficient room between the sidewalls of the load-locking chamber and the substrate. On the contrary, if reducing a space between the sidewalls of the load-locking chamber so that they are also serve as positional restricting members for restricting the off-position of the substrate, then it will be possible to reduce the number of sensing parts furthermore.

This second embodiment of the invention will be described below.

Figure 7:
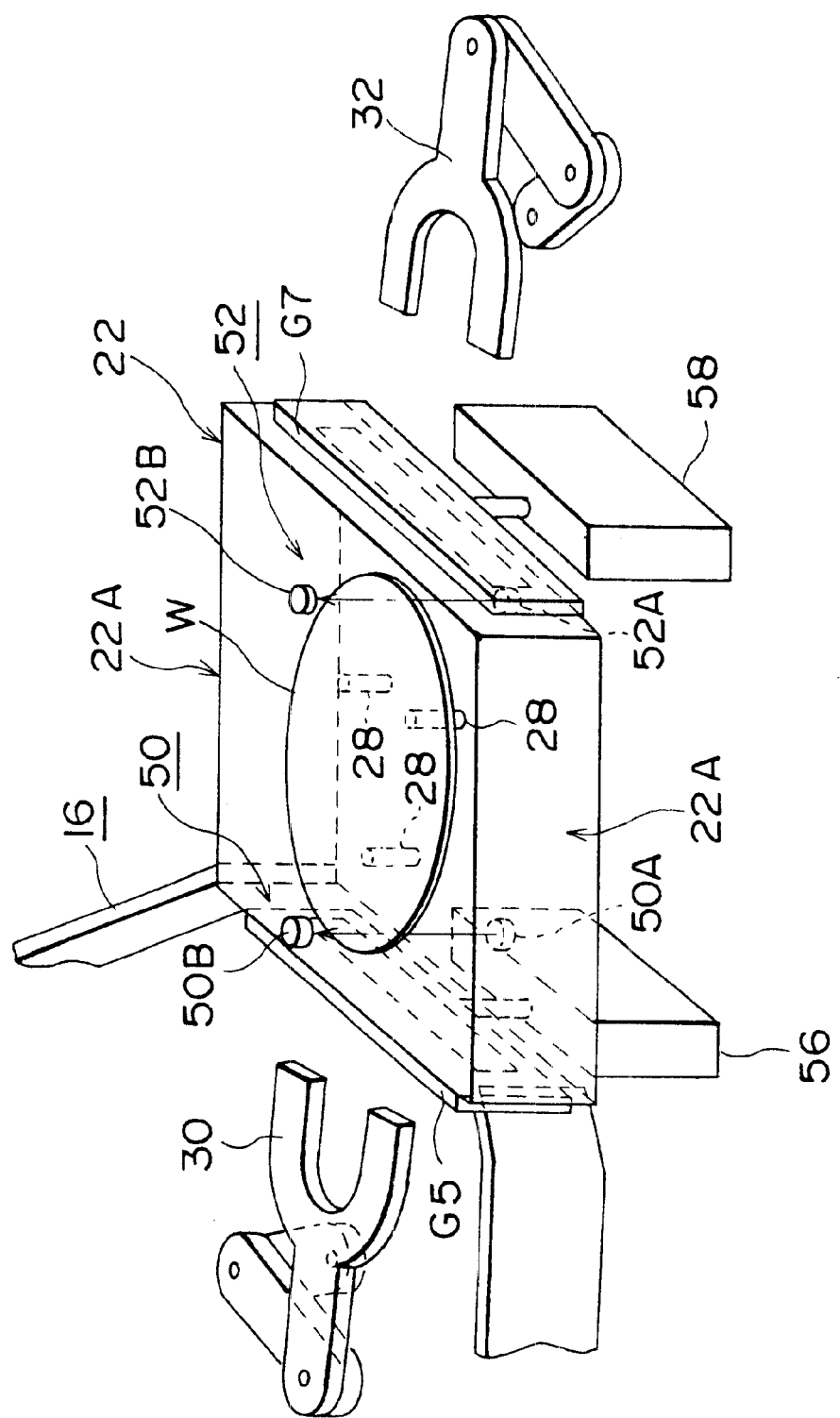
FIG. 7 is a perspective view showing the substrate detecting device of the second embodiment, which is disposed in the load-locking chamber.
Figure 10:
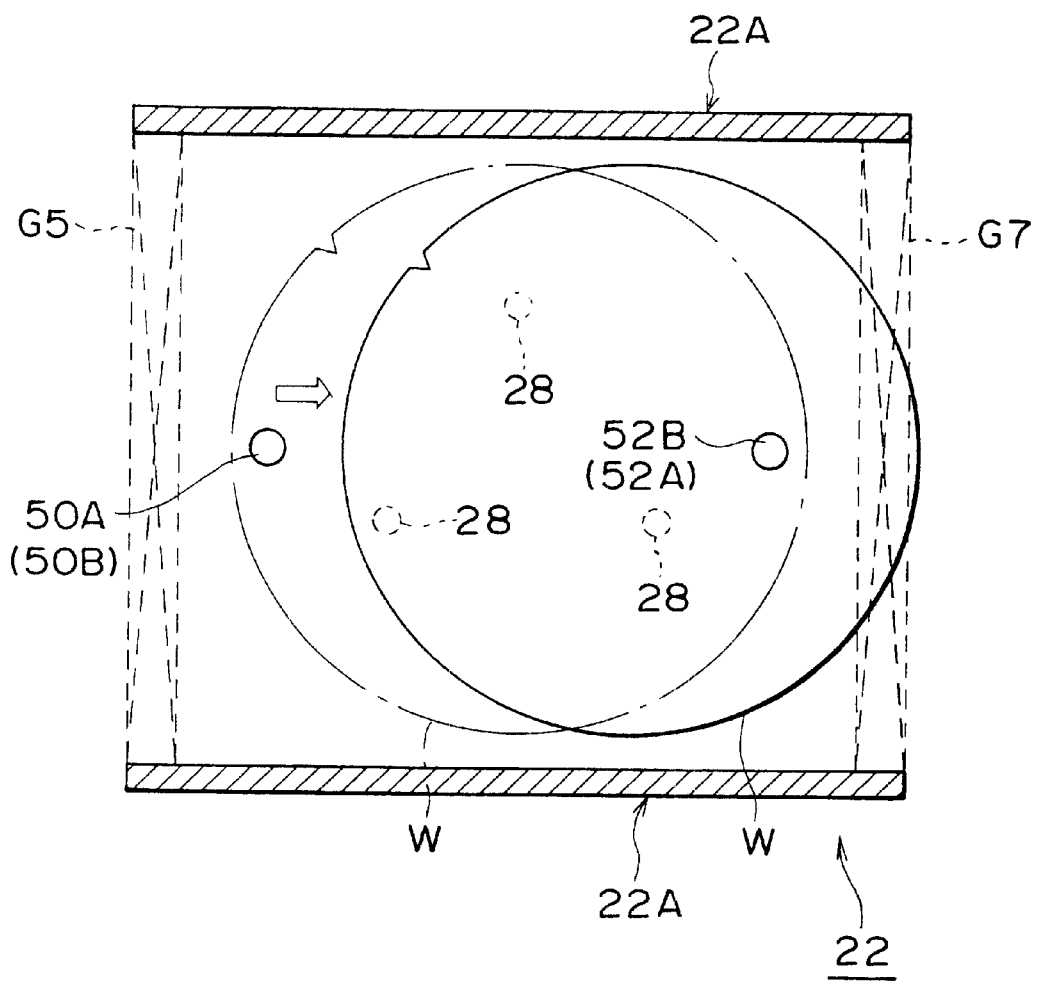
FIG. 10 is a view for explanation of the off-position of the substrate in the substrate detecting device of FIG. 7.

FIG. 7 is a perspective view showing the substrate detecting device of the second embodiment, the device being arranged in the load-locking chamber; FIG. 8 is a plan view of FIG. 7; FIG. 9 is a constructive circuit diagram showing the judgement control unit; and FIG. 10 is a view for explanation of the off-position of the substrate. Note, in the second embodiment, elements identical to those of the first embodiment mentioned in advance, are respectively indicated with the same reference numerals and their explanations are eliminated.

In order to simplify the explanation, FIG. 7 shows the only substrate detecting device in the single load-locking chamber, for example, the device in the chamber 22; nevertheless the device in the not-shown other load-locking chamber 24 is also constructed in the same way. Note, in FIG. 8, the substrate W shown by the alternate long and short dash lines occupies the formal position.

In this embodiment, both sidewalls 22A, 22A of the load-locking chamber 22 serve as positional restricting members for restricting the substrate's shifting sideways of the substrate W. Namely, as shown in FIG. 8, a distance L3 between the outer peripheral edge of the substrate W in the formal position and the inner faces of both sidewalls 22A, 22A is established so as to be the maximum allowable displacement of the off-position for the substrate W. The distance L3 ranges from 5 to 10 mm, more or less, in case of the wafer of 12 in. size. In this way, the establishment of the distance between both of the sidewalls 22A, 22A allows it to restrict the occurrence of the substrate's off-position in excess of the allowance in the direction of the sidewall 22A. Accordingly, we have only to work out measures against the substrate's off-position in the directions to the gate valves G5, G7. Under such a situation, according to the second embodiment, two substrate sensing parts 50, 52 are respectively arranged along a direction generally perpendicular to the opposing direction of the sidewalls 22A, 22A, namely, the direction to arrange the gate valves G5, G7 in the shown embodiment. Therefore, these sensing parts 50, 52 are arranged in general symmetry with each other about the center of the substrate W in the diametrical direction of 180 degrees.

Similarly to the previously embodiment, both of the sensing parts 50, 52 comprise emitters 50A, 52A and receptors 50B, 52B arranged down and up so as to interpose the periphery of the substrate W therebetween. The sensing parts 50, 52 are also arranged inside the outer peripheral edge of the substrate W by the predetermined distance L2. This distance L2 corresponds to the maximum allowable distance for the substrate W in the off-position. For example, the distance L2 will be from 5 to 10 mm, more or less.

In addition to the NAND circuit 42, the OR circuit 44 and the AND circuit 46 all shown in FIG. 5, the judgement control unit 40 in order to process the outputs of the respective receptors 50B, 52B of two substrate sensing parts 50, 52 further includes a "off-position" direction determining part 54. In this embodiment, it is executed to judge which of directions the off-position of the substrate does occur in accordance with the outputs from the receptors 50B, 52B. Note, reference numerals 56, 58 denote valve driving units which allow to open and close the gate valves G5, G7, respectively.

According to the so-constructed second embodiment, when the substrate W is mounted on three support pins 28, there is no possibility of the occurrence of off-position in excess of the allowance in the opposing direction of both sidewalls 22A, 22A of the load-locking chamber 22 since they act as the position restricting members.

While, when the substrate W does produce a displacement more than the allowance in the direction of the gate valve G5 or G7, such an off-position of the substrate is detected by the substrate sensing parts 50, 52. In FIG. 10, the substrate in the formal position is designated by alternate long and short dash lines, while the solid line represents a condition that the substrate's position is deviated to the side of the sensing part 52 in excess of the allowance. The logical operations of the respective circuits in the judgement control unit 40 of FIG. 9 are similar to those in case of FIG. 5 with the exception of two inputs in place of three inputs. Thus, when at least either one of two receptors 50B, 52B detects the presence of the substrate, then the judgement control unit 40 does judge that the substrate is present now. In this state, when either one of the receptors detects the absence of the substrate, then the judgement control unit 40 does judge that the substrate is in the off-position in excess of the allowance.

Then, in case of the off-position in excess of the allowance, the "off-position" direction determining part 54 determines which of directions the off-position of the substrate does occur, on the basis of the outputs from the receptors 50B, 52B.

For example, when the substrate W is shifted to the direction of the gate valve G7 as shown in FIG. 10, the opposite receptor 50B detects the absence of the substrate and therefore, it is possible to judge that substrate W is in the off-portion to the side of the receptor 52B of the gate valve G7. If closing the gate valve G7 under such a situation, the substrate W will be pinched into its breakage. For this reason, the "off-position" direction determining part 54 outputs a prohibit signal to prohibit the closing operation of the corresponding gate valve.

Figure 11:
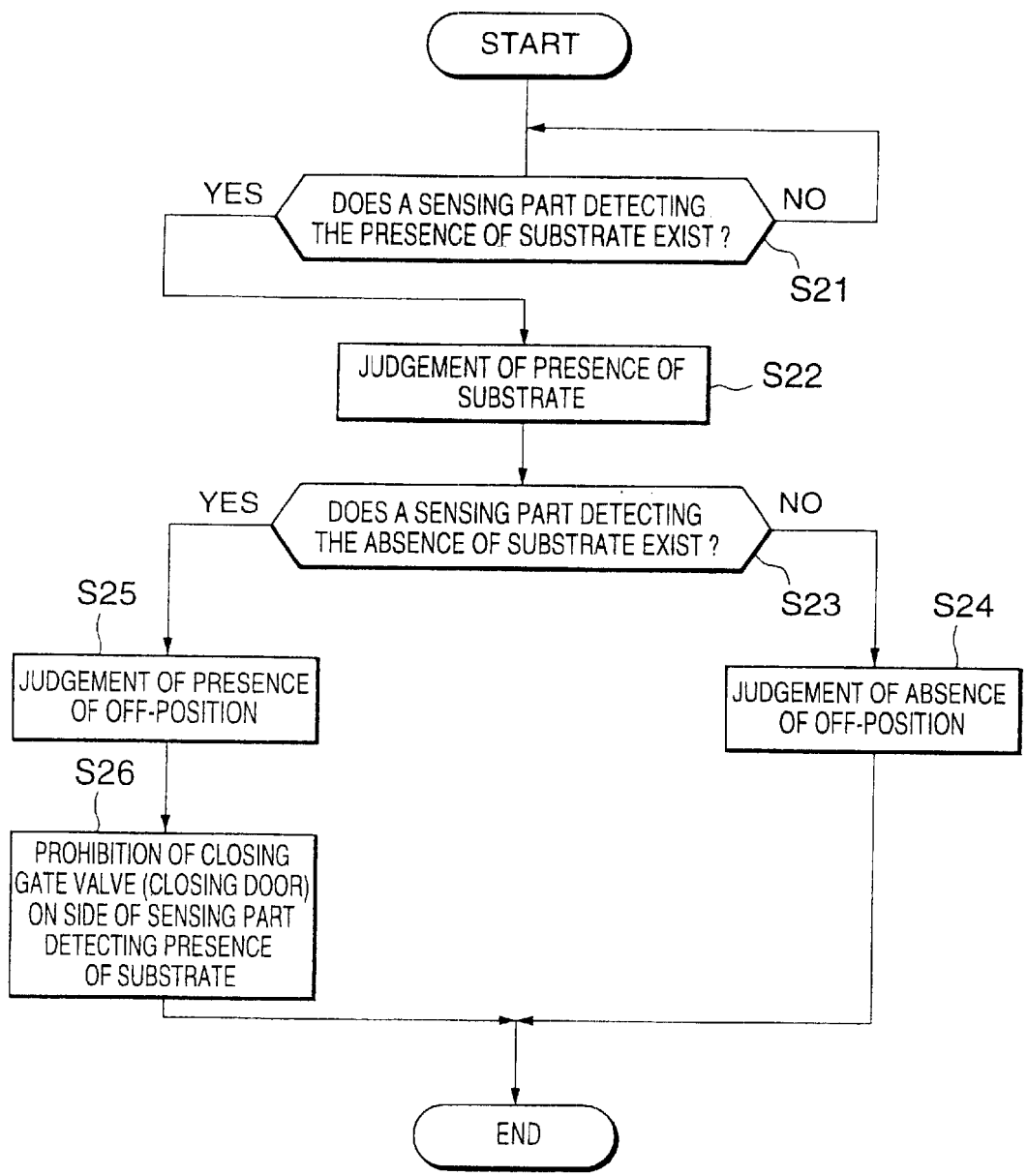
FIG. 11 is a flow chart for explanation of the operation of the substrate detecting device in accordance with the second embodiment.

We now describe such a series of operations with reference to the flow of FIG. 11, summarily. Note, this flow chart is provided by the only addition of a step S26 to the flow chart of FIG. 6.

Upon the initiation of the substrate detecting device's operating, it is firstly executed to judge whether at least either one of two substrate sensing parts 50, 52 does detect the presence of the substrate (S21). This judgement process is repeated until the appearance of the sensing part detecting the presence of the substrate.

If there is even one sensing part detecting the presence of the substrate, then the judgement control unit 40 judges that the substrate W is present (S22). Further, it is judged whether there exists a substrate sensing part detecting the absence of the substrate or not (S23). When the judgement is NO, that is, in case of both sensing parts detecting the presence of the substrate, then the judgement control unit 40 judges that the substrate W is not in the off-position but the formal position (S24). On the contrary, when the judgement at step S23 is YES, that is, in case of the other sensing part detecting the absence of the substrate, then the judgement control unit 40 judges that the substrate W is in the off-position (S25).

Then, it is executed in this state to prohibit the closing operation of the gate valve on the side of the sensing part detecting the presence of the substrate (S26). Consequently, it is possible to prevent the substrate W in the off-position from being pinched and damaged by the gate valve.

According to the second embodiment, since the employ of the sidewalls 22A, 22A of the load-locking chamber as the position restricting members allows the abolition of the off-position in the direction of the opposing sidewalls 22A, 22A in excess of the allowance, it is possible to judge the presence of the substrate and the existence of off-position (direction of gate valve) in excess of the allowance, by only providing two substrate sensing parts.

Additionally, since the distance between the opposing sidewalls 22A, 22A of the load-locking chamber is narrowed down as possible, it is possible to make the space or volume of the load-locking chamber considerably smaller.

The above embodiment has been described while giving the example to apply the present invention on the load-locking chambers of the cluster-type of processing apparatus. Of course, the present invention is not limitative to this example and therefore, the present invention is also applicable to the load-locking chamber connected to a single vacuum processing chamber.

Again, although the above embodiment has been described by example of the substantially circular semiconductor wafer as the substrate, the present invention is not limitative to this and therefore, the present invention is also applicable to a square-shaped substrate, such as a LCD substrate.

Figure 12:
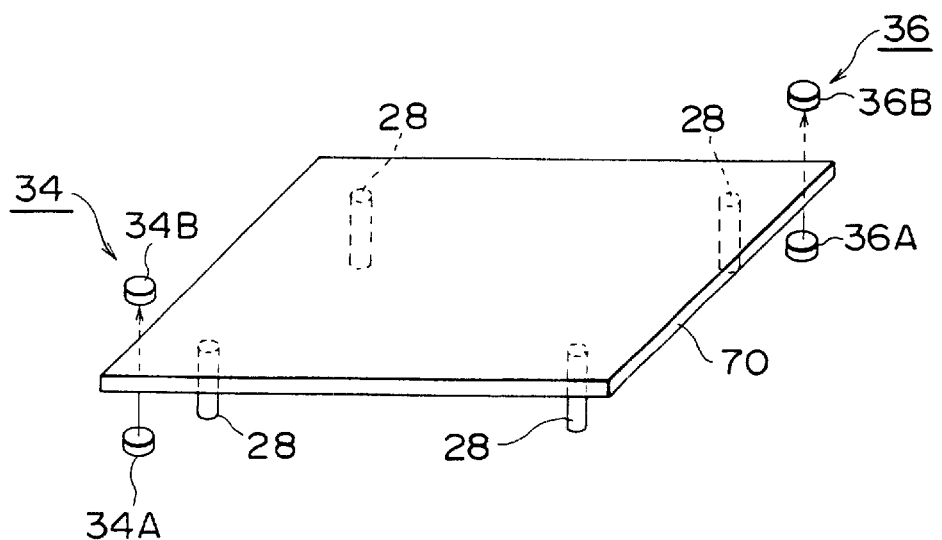
FIG. 12 is a view showing a condition in case of the application of the present invention to a square substrate.

FIG. 12 is a perspective view showing the above modification. In this case, there are provided two substrate sensing parts 34, 36 on two opposing corners in one diagonal direction of a square-shaped substrate 70 having two diagonal lines and also inward from each of the corners by a small distance (corresponding to the allowance for the off-position).

Also in this case, the presence of the substrate 70 and the existence of off-position in excess of the allowance can be detected by two sensing parts 34, 36, as similar to the previous case of the substantially circular substrate. Further, since the sensing parts are not positioned outside the substrate but above and below the diagonal corners of the substrate, it is possible to make the space or volume of the load-locking chamber smaller.

Note, the emitters and the receptors may be arranged in the load-locking chamber. Alternatively, the emitters and the receptors may be arranged outside the load-locking chamber on condition that the load-locking chamber is provided, on a wall thereof, with a viewing port which allows to peep the interior of the load-locking chamber.

Figure 13:
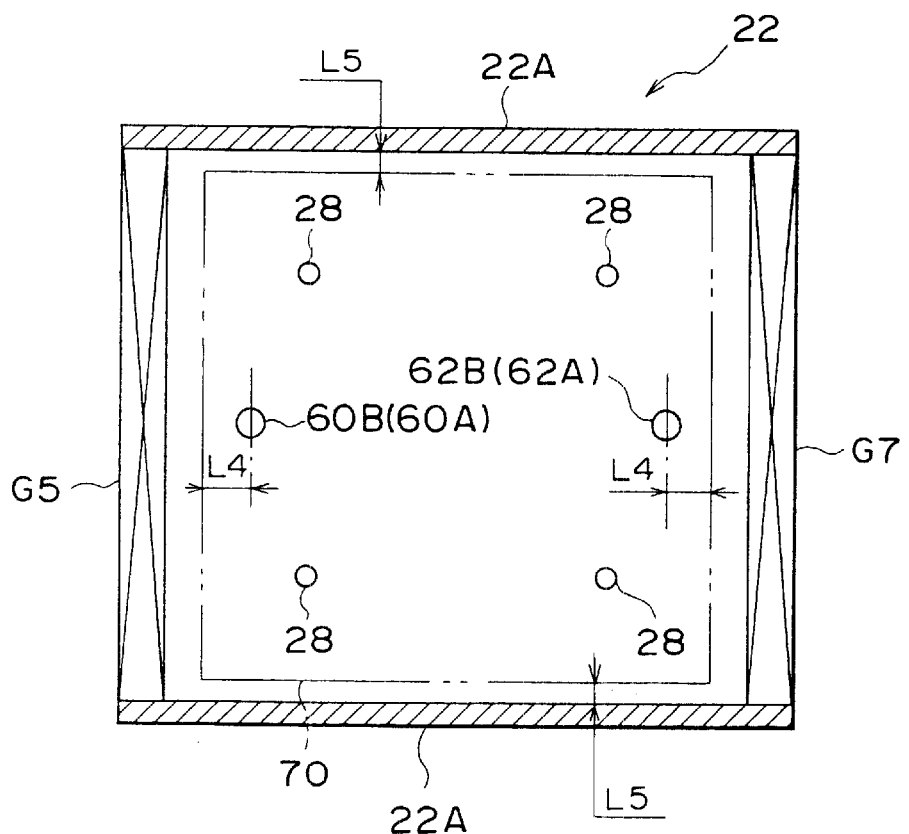
FIG. 13 is a plan view showing the substrate detecting device for the square substrate, which is disposed in the load-locking chamber.

FIG. 13 shows the substrate detecting device in which the substrate restricting walls are arranged on both sides of the substrate mounting part for mounting the square substrate thereon.

In this figure, the load-locking chamber 22 includes the opposing sidewalls 22A, 22A and the gate valves G5, G7 positioned in the direction perpendicular to the opposing direction of the sidewalls 22A, 22A. Furthermore, the load-locking chamber 22 is provided, on its bottom, with four support pins 28. Mounted on the support pins 28 in a predetermined position (shown by alternate long and short dash lines in the figure) is the substrate 70 which is in the form of a square. The distance between the opposing sidewalls 22A, 22A is established so as to produce a distance L5 between the square substrate 70 and the sidewalls 22A, 22A. The distance L5 corresponds to the maximum allowable amount of "off-position" (positional deviation) for the substrate, as similar to the embodiment of FIG. 8. In the load-locking chamber 22, substrate sensing parts 60B (60A), 62B (62A) are arranged on respective sides of the gate valves G5, G7, respectively. These substrate sensing parts 60B, 62B are also arranged in respective positions each departing inside the outer edge of the square substrate 70 in the predetermined position by a distance L4. The substrate detecting device in the load-locking chamber 22 has the functions and effects which are similar to those in case of the circular substrate shown in FIG. 8.

As mentioned above, according to the substrate detecting device of the invention, it is possible to judge the presence of the substrate and the existence of the substrate's off-position in excess of the allowance by a small number of sensing parts, e.g. three sensing parts since the substrate sensing parts are arranged inside the outer edge of the substantially circular substrate.

Accordingly, not only can the present device reduce the number of sensing parts in comparison with the conventional device, but it is possible to minimize the space for accommodating the substrate, for example, the space or volume of the load-locking chamber.

In particular, when the sidewalls of the load-locking chamber are also used as the position restricting members for preventing the off-position of the substrate, the directions of off-position caused in the substrate are so limited as to make do with two substrate sensing parts only, whereby the number of the sensing parts can be further reduced. Additionally, as the distance between the sidewalls is also minimized in the above case, it is possible to decrease the space or volume in the load-locking chamber, furthermore.

Again, since the substrate sensing parts are arranged in just inward positions of the diagonal corners of the substrate in the form of a substantial square, the presence of the substrate and the existence of off-position exceeding the allowance can be detected by, for example, two sensing parts.

Therefore, not only can the present device reduce the number of sensing parts, but it is possible to reduce the space for accommodating the substrate, for example, the space or volume of the load-locking chamber.

What is claimed is:

1. A substrate detecting device for detecting presence and off-position of a circular substrate mounted on a substrate mounting part in a load-locking chamber capable of forming a vacuum, the substrate detecting device comprising:

two substrate sensing parts each of which is arranged in a position inwardly departing from an outer peripheral edge of the substrate arranged in a designated position on the substrate mounting part, by a predetermined distance and which are arranged away from each other in the circumferential direction of the substrate;

a judgment controlling unit for judging the presence of the substrate on the substrate mounting part and the existence of the substrate's off-position being deviated from the designated position, on the basis of respective outputs from the two substrate sensing parts; and a pair of opposing substrate restricting walls which are arranged on both sides of the substrate mounting part for restricting the mounting position of the substrate to the inside of the substrate restricting walls;

wherein the predetermined distance is equal to a maximum amount of the off-position allowed for the substrate;

wherein the judgment controlling unit judges:

the presence of the substrate on condition that at least one of the two substrate sensing parts detects the presence of the substrate; and the existence of the off-position on condition that one of the two substrate sensing parts detects the presence of the substrate and the other substrate sensing parts does not detect the substrate; and wherein the two substrate sensing parts are arranged in a direction substantially perpendicular to the opposing direction of the substrate restricting walls in pairs.

2. A substrate detecting device as claimed in claim 1, wherein the judgment control unit judges the direction of the off-position of the substrate on the basis of the respective outputs from the two substrate sensing parts when the off-position of the substrate is detected, and prohibits the closing operation of an opening and closing door which is one of opening and closing doors provided with the load-locking chamber for the substrate to be loaded and unloaded and towards which the substrate is shifted.

3. A substrate detecting device for detecting a presence and an off-position of a circular substrate mounted on a substrate mounting part in a load-locking chamber capable of forming a vacuum, the substrate detecting device comprising:

two substrate sensing parts, each of the substrate sensing parts being arranged in a position inwardly departing from an outer peripheral edge of the substrate by a predetermined distance while the substrate is at a designated position on the substrate mounting part, and each of the substrate sensing parts being arranged away from each other in a circumferential direction of the substrate;

a judgment controlling unit for judging the presence of the substrate on the substrate mounting part, and existence of substrate off-position as a deviation of the substrate from the designated position on the basis of respective outputs from the two substrate sensing parts; and a pair of opposing substrate restricting walls which are arranged on both sides of the substrate mounting part, for restricting the mounting position of the substrate to inside of the substrate restricting walls, wherein a distance between the outer peripheral edge of the substrate arranged in the designated position and the substrate restricting wall is equal to a maximum amount of off-position allowed for the substrate, wherein the predetermined distance is equal to the maximum amount of off-position allowed for the substrate, wherein the judgment controlling unit judges:

the presence of the substrate on condition that at least one of the two substrate sensing parts detects the presence of the substrate, and the existence of the off-position on condition that one of the two substrate sensing parts detects the presence of the substrate and the other of the two substrate sensing parts does not detect the substrate.

4. A substrate detecting device as claimed in claim 3, wherein the two substrate sensing parts are arranged in a direction substantially perpendicular to an opposing direction of the substrate restricting walls in pairs.

5. A substrate detecting device as claimed in claim 4, wherein the judgment control unit judges a direction of the off-position of the substrate on the basis of the respective outputs from the two substrate sensing parts when the off-position of the substrate is detected, and wherein the judgment control unit prohibits a closing operation of an opening and closing door which is one of opening and closing doors provided with the load-locking chamber.

6. A substrate detecting device as claimed in claim 3, wherein the judgment control unit judges a direction of the off-position of the substrate on the basis of the respective outputs from the two substrate sensing parts when the off-position of the substrate is detected.

* * * * *